(12) United States Patent
Sakuragi

(10) Patent No.: US 6,917,080 B2
(45) Date of Patent: Jul. 12, 2005

(54) BIPOLAR TRANSISTOR AND SEMICONDUCTOR DEVICE USING SAME

(75) Inventor: Masahiro Sakuragi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 35 days.

(21) Appl. No.: 10/397,648

(22) Filed: Mar. 26, 2003

(65) Prior Publication Data
US 2004/0007713 A1 Jan. 15, 2004

(30) Foreign Application Priority Data
Mar. 27, 2002 (JP) ..................................... P. 2002-088689

(51) Int. Cl.[7] .......................... H01L 23/62; H01L 29/76
(52) U.S. Cl. ...................... 257/355; 257/370; 257/567
(58) Field of Search ................................ 257/255, 355, 257/356, 370, 567, 577, 565

(56) References Cited

U.S. PATENT DOCUMENTS

| | | | | |
|---|---|---|---|---|
| 4,686,557 A | * | 8/1987 | Mahrla | 257/541 |
| 5,027,252 A | * | 6/1991 | Yamamura | 361/58 |
| 5,530,381 A | * | 6/1996 | Nakagawa | 326/101 |
| 5,545,918 A | * | 8/1996 | Dos Santos et al. | 257/577 |
| 5,665,615 A | * | 9/1997 | Anmo | 438/202 |
| 6,130,122 A | * | 10/2000 | Johnson | 438/202 |
| 6,590,273 B2 | * | 7/2003 | Okawa et al. | 257/544 |
| 2002/0079555 A1 | * | 6/2002 | Okawa et al. | 257/565 |

FOREIGN PATENT DOCUMENTS

| | | | |
|---|---|---|---|
| JP | 58-051556 | 3/1983 | |
| JP | 02-260641 | 10/1990 | |
| JP | 05-206153 | * 8/1993 | ......... H01L/21/331 |
| JP | 2001-291781 | * 10/2001 | ....... H01L/21/8238 |

* cited by examiner

*Primary Examiner*—T. N. Quach
(74) *Attorney, Agent, or Firm*—Merchant & Gould P.C.

(57) ABSTRACT

A bipolar transistor is provided, which is low in collector-to-emitter saturation voltage, small in size and to be manufactured by a reduced number of processes, and a semiconductor device formed with such a bipolar transistor and a MOS transistor on a same substrate. A high concentration region for reducing the collector-to-emitter saturation voltage VCE(sat) is formed in a manner surrounding a base region of an NPN transistor. This high concentration region is not necessarily formed in such a depth as reaching a buried layer, and can be reduced in the spread in a lateral direction. Because a high concentration region can be formed in a same process as upon forming source and drain regions for an NMOS transistor to be formed together with an NPN transistor on a same silicon substrate, it is possible to omit a diffusion process exclusive for forming a high concentration region and hence to manufacture a semiconductor device through a reduced number of processes.

3 Claims, 4 Drawing Sheets

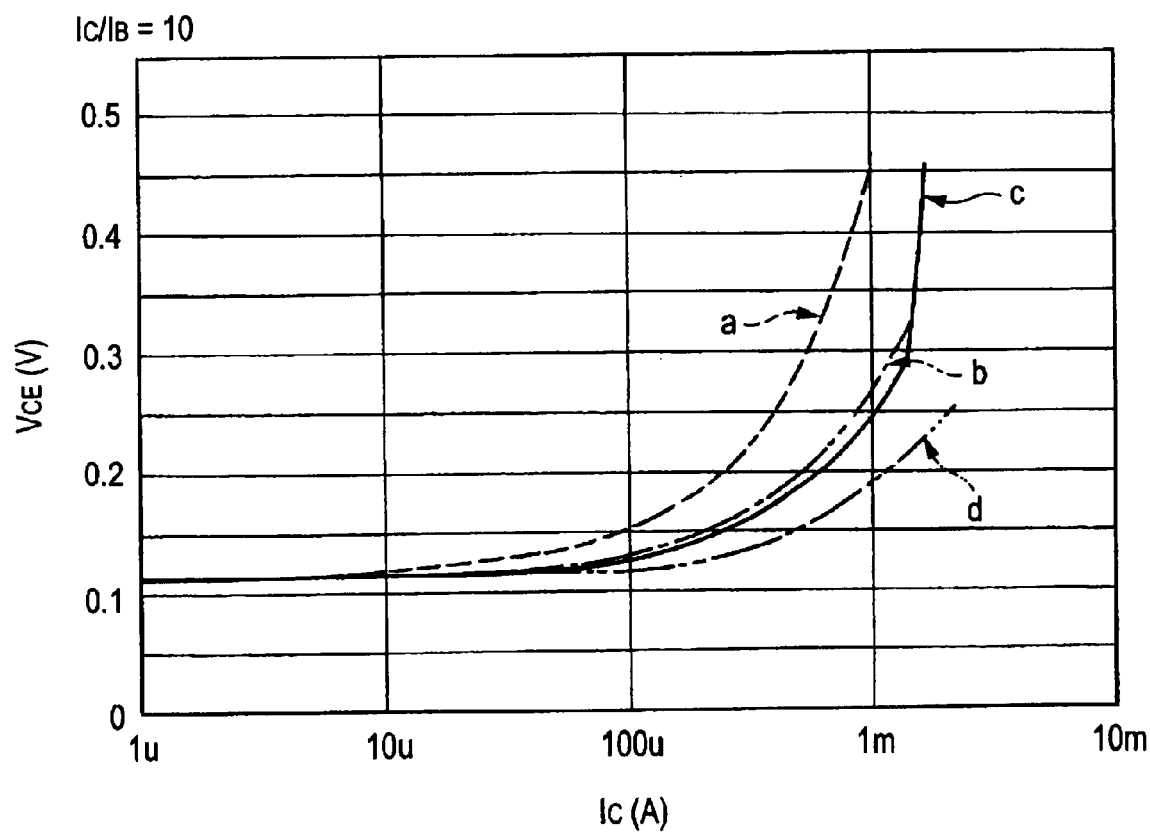

PRIOR ART FIG. 5 (a)
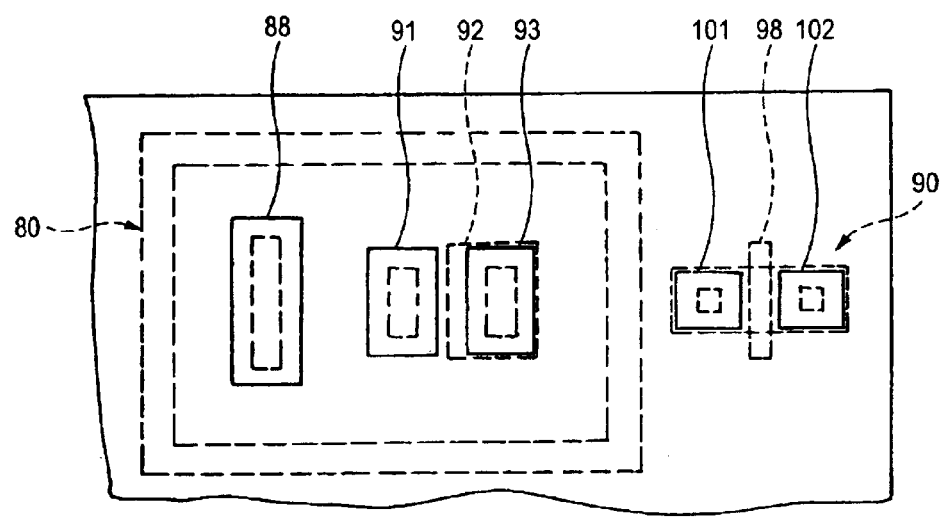
PRIOR ART FIG. 5 (b)
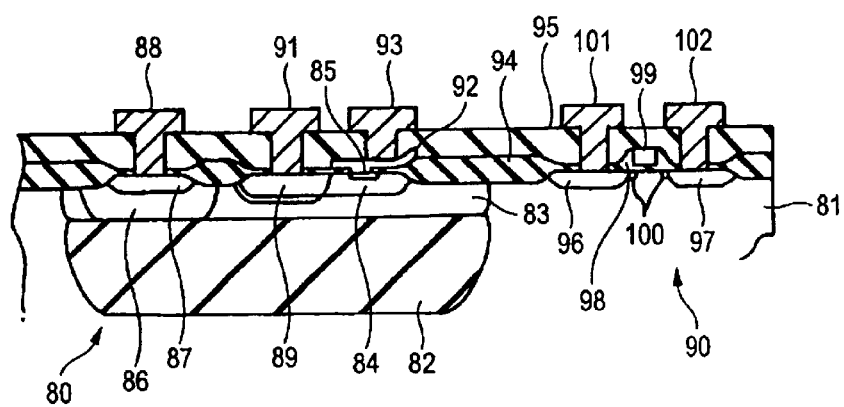

BIPOLAR TRANSISTOR AND SEMICONDUCTOR DEVICE USING SAME

BACKGROUND OF THE INVENTION

1. Field of the Invention

This invention relates to bipolar transistors and semiconductor devices and, more particularly, to a bipolar transistor lowered in collector-to-emitter saturation voltage VCE(sat) and a semiconductor device formed with such a bipolar transistor and a MOS transistor on a same substrate.

2. Description of the Related Art

There is shown, in FIG. 5, a structure of a semiconductor device in an related art formed with NPN and NMOS transistors on a same substrate. FIG. 5A is a plan view while FIG. 5B is a sectional view of the same.

An NPN transistor 80 includes an $N^+$ buried layer 82 formed of As (arsenic), Sb (antimony) or the like in a P-type silicon substrate 81, a collector region 83 formed thereon by an $N^-$ layer, a base region 84 formed by a $P^-$ layer in the collector region 83, and an emitter region 85 formed by an N layer in the base region 84. In the collector region 83, a collector wall 86 is formed by an $N^+$ layer diffused with P (phosphorus). In the collector wall 86, a collector contact region 87 is formed by an $N^+$ layer diffused with As in the contact wall 86. A collector electrode 88 is connected to a surface of the collector contact region 87. The collector wall 86 is provided in order to lower the collector series resistance of the NPN transistor 80, to reduce the collector-to-emitter saturation voltage VCE(sat). A base electrode 91 is connected to the base region 84 through a $P^+$-layered base contact region 89. An emitter electrode 93 is connected to the emitter region 85 through an emitter contact region 92. The reference 94 represents a device-isolation oxide layer (LOCOS) while the reference 95 shows an insulation film.

The NMOS transistor 90 includes a source region 96 and drain region 97 formed by an $N^+$ layer diffused with As in the P-type silicon substrate 81, and a gate electrode 99 formed by an $SiO_2$ film through a gate insulation film 98 on an intermediate region between the source region 96 and the drain region 97. In the periphery of the gate electrode 99, an $N^-$ LDD region 100 is formed by diffusion with P (phosphorus). A source electrode 101 is connected to the source region 96, while a drain electrode 102 is connected to the drain region 97.

As described above, the NPN transistor 80 of the related-art semiconductor device has a collector wall 86 for the purpose of lowering the collector-to-emitter saturation voltage VCE(sat). The collector wall 86, being formed deeper as reaching the buried layer 82 by the thermal diffusion of a high concentration impurity, is likely to spread laterally over a broad range. This increases spacing between the collector electrode 88 and the base electrode 91, resulting in a problem of increased transistor size. Meanwhile, in order to form a collector wall 86 to such a depth as reaching the buried layer 82, there is a need of a thermal diffusion process exclusive for forming a collector wall 86. Thus, there arises a problem of incurring the increase in the number of processes for an NPN transistor 80 and, eventually, a semiconductor device having NPN transistors 80.

SUMMARY OF THE INVENTION

It is an object of the present invention to provide a bipolar transistor which is low in collector-to-emitter saturation voltage, small in size and to be manufactured by the reduced number of processes, and a semiconductor device formed with such a bipolar transistor and a MOS transistor on a same substrate.

In order to achieve the above object, a bipolar transistor of the present invention comprises, in a bipolar transistor having a base region formed in a collector region and an emitter region formed in the base region: a high concentration region for reducing a collector-to-emitter saturation voltage is formed in a manner surrounding substantially an entire periphery of the base region.

This high concentration region is formed in a manner substantially surrounding an entire periphery of the base region, in which can lower the collector-to-emitter saturation voltage without the necessity of forming in such a depth as reaching the buried layer as required in the collector wall of the related-art bipolar transistor, thereby making it possible to reduce the spread in a lateral direction. Accordingly, the bipolar transistor can be made smaller in size than the related art. Also, because the high concentration region can be formed by utilizing the fabrication process for other elements to be formed together with the bipolar transistor on the same substrate, the bipolar transistor can be fabricated through a reduced number of processes by omitting the diffusion process exclusive for forming a high concentration region.

A semiconductor device of the invention comprises: in a semiconductor device formed, on a same substrate, with a bipolar transistor having a base region formed in a collector region and an emitter region formed in the base region and a MOS transistor, a high concentration region for reducing a collector-to-emitter saturation voltage is formed in a manner surrounding substantially an entire periphery of the base region.

This high concentration region, because not necessarily to be formed in such a depth as reaching the buried layer as in the collector wall of the related-art bipolar transistor, making it possible to reduce the spread in a lateral direction. Accordingly, the bipolar transistor can be made smaller in size than that of the related art. Also, because the high concentration region can be formed by utilizing the fabrication process for a MOS transistor to be formed together with the bipolar transistor on the same substrate, it is possible to omit the diffusion process exclusive for forming a high concentration region. Consequently, the thermal process for diffusion can be reduced, it is possible to reduce the spread in diffusion length of the already formed diffusion region, making it possible to provide an accurate, reliable semiconductor device. Also, because diffusion process is omitted once, a semiconductor device can be manufactured by smaller number of processes.

The high concentration region may be formed in the same process as source and drain regions of the MOS transistor. In this manner, by forming a high concentration region for reducing the bipolar-transistor collector-to-emitter saturation voltage in a same process as the source and drain regions for the MOS transistor, the bipolar transistor can be fabricated through a smaller number of processes by omitting the diffusion process exclusive for forming a high concentration region.

The high concentration region is desirably formed in the same process as regions for countermeasure against breakdown provided in source and drain regions of the MOS transistor. In this manner, by forming a high concentration region for reducing the bipolar-transistor collector-to-emitter saturation voltage in a same process as the source and drain regions for the MOS transistor, the bipolar transistor can be fabricated through a smaller number of processes by omitting the diffusion process exclusive for forming a high concentration region.

The high concentration region desirably comprises a first region formed in the same process as regions for countermeasure against breakdown provided in source and drain regions of the MOS transistor, and a second region formed in the same process as the source and drain region of the MOS transistor. In this manner, by structuring a high concentration region for reducing the bipolar-transistor collector-to-emitter saturation voltage with a first region formed in a same process as the breakdown-countermeasure regions for the MOS transistor and a second region formed in a same process as source and drain regions, a semiconductor device can be manufactured through a smaller number of processes than the related art.

BRIEF DESCRIPTION OF THE DRAWINGS

FIG. 4 is a figure showing a measurement result of collector-to-emitter resistance characteristic (VCE(sat)/IC); and FIG. 5A is a plan view showing a structure of a semiconductor device of a related art, while FIG. 5B is a sectional view of the same.

DESCRIPTION OF THE PREFERRED EMBODIMENTS

Now, an embodiment of the present invention will be explained with reference to the drawings.

Figure 1:
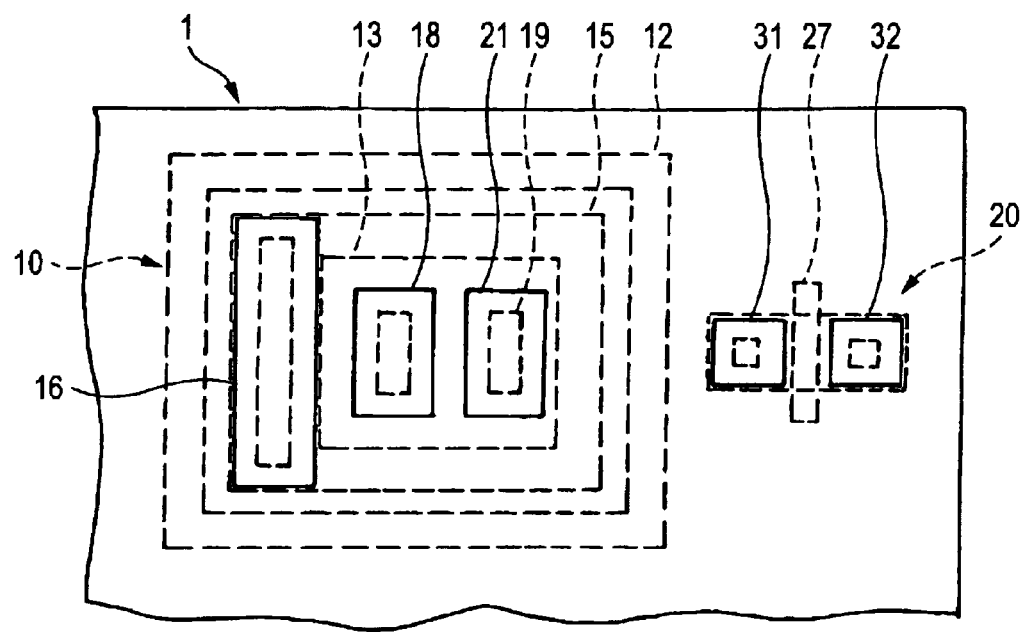
FIG. 1A is a plan view showing a first embodiment of a semiconductor device according to the present invention.
FIG. 1B is a sectional view of the same.
Figure 1:
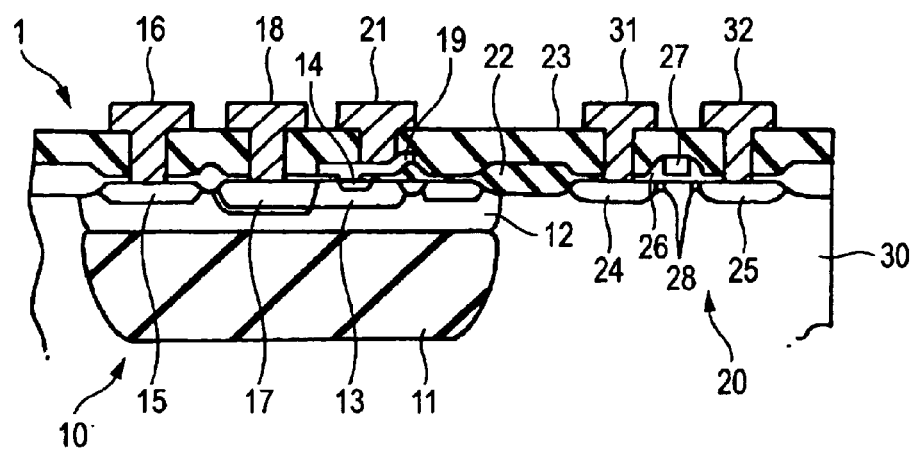
Figure 2:
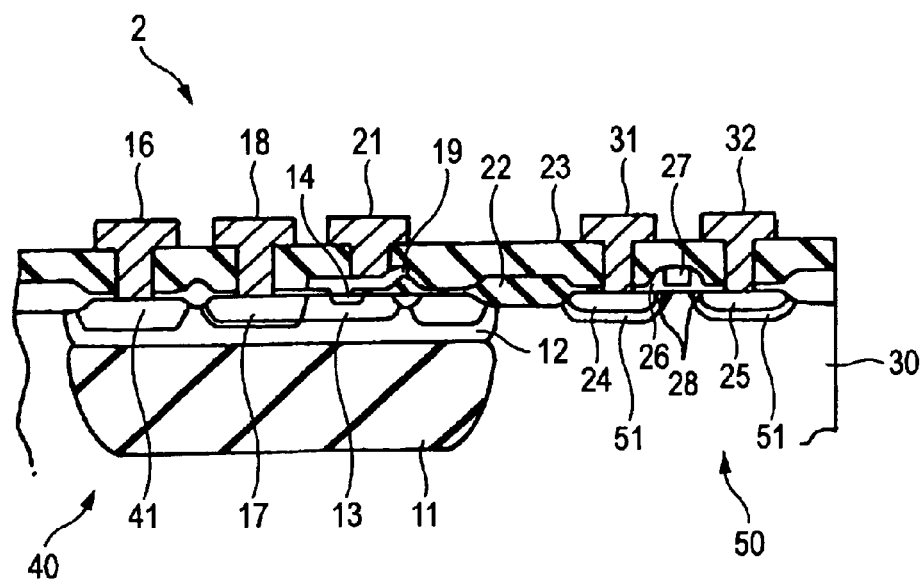
FIG. 2 is a sectional view showing a second embodiment of a semiconductor device according to the invention.

FIG. 1A is a plan view showing a first embodiment of a semiconductor device according to the invention while FIG. 2 is a sectional view of the same. The semiconductor device 1 is formed with an NPN transistor 10 and an NMOS transistor 20 on a same silicon substrate 30.

The NPN transistor 10 includes an $N^+$ buried layer formed by diffusing As (arsenic), Sb (antimony) or the like to the P-type substrate 30, a collector region 12 formed thereon by an $N^-$ layer, a base layer 13 formed by a $P^-$ layer in the collector layer 12, and an emitter layer 14 formed by an N layer in the base region 13.

In the collector region 12, a high concentration region 15 is formed in a manner fully surrounding the entire periphery of the base region 13, in order to reduce the collector-to-emitter saturation voltage VCE(sat). A collector electrode 16 is connected to the high concentration region 15. The high concentration region 15 is an $N^+$ layer diffused with As (arsenic).

In the base region 13, a base contact region 17 is formed by a $P^+$ layer. A base electrode 18 is connected to a surface of the base contact region 17. In the emitter region 14, an emitter electrode 21 is connected to the emitter region 14 through an emitter contact region 19. The reference 22 represents a device-isolation oxide layer (LOCOS) while the reference 23 an insulator film.

The NMOS transistor 20 includes a source region 24 and drain region 25 formed by an $N^+$ layer due to diffusing As to the P-type silicon substrate 30, and a gate electrode 27 formed by an $SiO_2$ film on an intermediate region between the source region 24 and the drain region 25. In the periphery of the gate electrode 27, a low concentration diffusion region (LDD) 28 is formed by an $N^-$ layer diffused with P (phosphorus). A source electrode 31 is connected to the source region 24, while a drain electrode 32 is to the drain region 25.

The high concentration region 15 is formed in the same process as in forming the source region 24 and drain region 25 for the NMOS transistor 20. Namely, when As is diffused to the P-type silicon substrate 30 to form a source region 24 and drain region 25 by an $N^+$ layer, As (arsenic) is diffused at the same concentration as the source region 24 and drain region 25 to the collector region 12, thereby forming an $N^+$-layered high concentration region 15.

The high concentration region 15 does not require such a depth reaching the buried layer 82 (11) as required by the collector wall in the NPN transistor 80 of the related-art structure, thus reduced in lateral spread. It is, accordingly, possible to reduce the size of the NPN transistor smaller than that of the conventional.

Also, by utilizing the forming process for the source region 24 and drain region 25 for the NMOS transistor 20, the high concentration region 15 was formed to reduce the collector-to-emitter saturation voltage VCE(sat) of the NPN transistor 10. This makes it possible to omit the diffusion process exclusive for forming a high concentration region 15 and hence to manufacture a semiconductor device by a reduced number of processes.

Meanwhile, the high concentration region 15 serves also as a guard ring to prevent against forming a parasitic transistor.

FIG. 2 is a sectional view showing a second embodiment of a semiconductor device according to the invention. The semiconductor device 2 is formed with an NPN transistor 40 and an NMOS transistor 50 on the same silicon substrate 30. The difference from the semiconductor device 1 of FIG. 1 lies in that the high concentration region 41 formed in a collector region 12 of an NPN transistor 40 is formed by an $N^+$ layer diffused with P (phosphorus) greater in diffusion coefficient than As (arsenic) and that the source region 24 and the drain region 25 of the NMOS transistor 50 are formed with respective regions 51, for countermeasure against static breakdown, diffused with P (phosphorus).

The high concentration region 41 is formed in the same process as in forming the regions 51 for countermeasure against static breakdown for the NMOS transistor 50. Namely, when P (phosphorus) is diffused in the P-type silicon substrate 30 to form $N^+$-layered regions 51 for countermeasure against static breakdown, the collector region 12 is diffused by P (phosphorus) in the same concentration as that of the breakdown-countermeasure regions 51 thereby forming an $N^+$-layered high concentration region 41.

In this manner, by utilizing the forming process of a breakdown-countermeasure regions 51 for the NMOS transistor 50, a high concentration region 41 is formed to reduce a collector-to-emitter saturation voltage VCE(sat) of the NPN transistor 40. This makes it possible to omit the diffusion process exclusive for forming a high concentration region 15 and hence to manufacture a semiconductor device 2 by a smaller number of processes.

Figure 3:
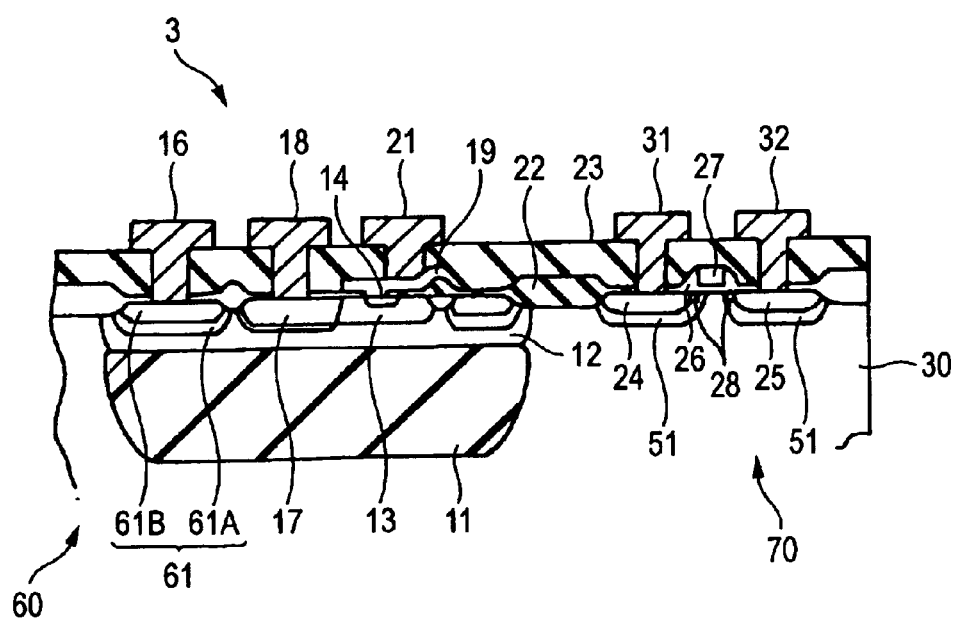
FIG. 3 is a sectional view showing a third embodiment of a semiconductor device according to the invention.

FIG. 3 is a sectional view showing a third embodiment of a semiconductor device according to the invention. The semiconductor device 3 is formed with an NPN transistor 60 and an NMOS transistor 70 on the same silicon substrate 30.

The difference from the semiconductor device 2 of FIG. 2 resides in that the high concentration region 61 formed in a collector region 12 of an NPN transistor 60 is formed by an N⁺-layered first region 61A diffused with P (phosphorus) and an N⁺-layered second region 61B diffused with As (arsenic).

The first region 61A of the high concentration region 61 is formed in the same process as in forming the breakdown-countermeasure regions 51 for the NMOS transistor 50, while the second region 61B is formed in the same process as in forming the source region 24 and drain region 25. Namely, when P (phosphorus) is diffused to the P-type silicon substrate 30 to form N⁺-layered regions 51 for countermeasure against breakdown, the collector region 12 is diffused by P (phosphorus) in the same concentration as that of the breakdown-countermeasure regions 51 thereby forming an N⁺-layered first region 61A. When As (arsenic) is diffused to the breakdown-countermeasure regions 51 to form N⁺ layers of source region 24 and drain region 25, the first region 61A is diffused by As in the same concentration as that of the source region 24 and drain region 25 thereby forming an N⁺-layered second region 61B.

In this manner, by the utilization of a forming process of a breakdown-countermeasure regions 51 and of a source region 24 and drain region 25 for the NMOS transistor 70, a high concentration region 61 is formed to reduce a collector-to-emitter saturation voltage VCE(sat) of the NPN transistor 40. This makes it possible to omit the diffusion process exclusive for forming a high concentration region 61 and hence to manufacture a semiconductor device 3 by a smaller number of processes.

FIG. 4 shows a measurement result of the collector-to-emitter resistance characteristic (VCE(sat)/IC) of the NPN transistor of the related-art structure shown in FIG. 5 and the NPN transistor of the structure in the embodiment shown in FIGS. 1 to 3, i.e. the changing characteristic of collector-to-emitter resistance VCE(sat) with respect to a collector current IC. As can be seen from this measurement result, the first embodiment has a resistance value somewhat increasing with increase in the value of collector current IC as compared to the related-art structure, as shown in the curve-b. However, it wholly exhibits nearly the same characteristic as that of the related-art structure. In the case of the second and third embodiments, the resistance value decreases with increase in the value of collector current IC, as shown in the curve-d. Herein, the curve-a represents a current-voltage characteristic in the case not forming a collector wall in the related-art structure.

Incidentally, the embodiment formed the high concentration region, for reducing the collector-to-emitter saturation voltage VCE(sat) for the NPN transistor, in a manner fully surrounding the entire periphery of the base region 13. However, the entire periphery may be formed with being partly omitted.

Meanwhile, the embodiment explained on the semiconductor device formed with the NPN and NMOS transistors on the same substrate. However, the invention is also applicable to a semiconductor device formed with NPN transistor and NMOS transistors on a same substrate. In such a case, nothing is required more than entirely reversing the dopant type and region conductivity type explained in the foregoing embodiment.

As explained above, the bipolar transistor of the invention, being formed with a high concentration region for lowering the collector-to-emitter saturation voltage in a manner fully surrounding the base region of the bipolar transistor, can lowr the collector-to-emitter saturation voltage without increasing the transistor size. Also, because the high concentration region can be formed by utilizing a fabrication process for other elements to be formed together with the bipolar transistor on the same substrate, it can be manufactured through a reduced number of processes by omitting the diffusion process exclusive for forming a high concentration region.

The semiconductor device of the invention, being formed with a high concentration region for lowering the collector-to-emitter saturation voltage in a manner fully surrounding the base region of the bipolar transistor, can lower the collector-to-emitter saturation voltage without increasing the transistor size. Also, because the high concentration region can be formed by utilizing a fabrication process for a MOS transistor to be formed together with the bipolar transistor on the same substrate, the diffusion process exclusive for forming a high concentration region is not required. An accurate, reliable semiconductor device can be manufactured by a reduced number of processes.

What is claimed is:

1. A semiconductor device comprising a bipolar transistor having a base region formed in a collector region, an emitter region formed in the base region, a barrier layer formed beneath the collector region, and a MOS transistor.

wherein a high concentration region for reducing a collector-to-emitter saturation voltage is formed in a manner surrounding substantially an entire periphery of the base region without reaching the barrier layer, the bipolar transistor and MOS transistor are formed on a same substrate, and the high concentration region is formed in a same process as a region against static breakdown which is provided in source and drain regions of the MOS transistor.

2. A semiconductor device according to claim 1, wherein the high concentration region is formed in a same process as source and drain regions of the MOS transistor.

3. A semiconductor device according to claim 1, wherein a high concentration region comprises a first region formed in a same process as regions against static breakdown provided in source and drain regions of the MOS transistor, and a second region formed in a same process as the source and drain region of the MOS transistor.

* * * * *